United States Patent [19]

Yamanaka et al.

[11] Patent Number: 5,444,660

[45] Date of Patent: Aug. 22, 1995

[54] SEQUENTIAL ACCESS MEMORY AND ITS OPERATION METHOD

[75] Inventors: Kazuya Yamanaka; Masatoshi Kimura, both of Hyogo, Japan

[73] Assignee: Mitsubishi Denki Kabushiki Kaisha, Tokyo, Japan

[21] Appl. No.: 834,049

[22] Filed: Feb. 11, 1992

[30] Foreign Application Priority Data

Apr. 2, 1991 [JP] Japan ................. 3-070149

[51] Int. Cl.6 ................. G11C 7/00; G11C 8/00; G11C 19/00
[52] U.S. Cl. ................. 365/189.12; 365/230.06; 365/239; 365/240
[58] Field of Search ................. 365/189.12, 230.06, 365/236, 239, 240; 377/72, 74, 105, 124, 129

[56] References Cited

U.S. PATENT DOCUMENTS

| | | | |
|---|---|---|---|
| 3,731,287 | 5/1973 | Seely et al. | 365/78 |
| 3,993,916 | 11/1976 | Copeland, III et al. | 377/79 |
| 4,044,339 | 8/1977 | Berg | 365/240 |
| 4,740,924 | 4/1988 | Tielert | 365/194 |
| 4,746,915 | 5/1988 | Sekiya | 377/129 X |
| 4,896,294 | 1/1990 | Shimizu et al. | 365/230.06 |
| 4,961,169 | 10/1990 | Matsumura et al. | 365/189.12 |
| 5,036,494 | 7/1991 | Wise et al. | 365/239 |
| 5,058,065 | 10/1991 | D'Luna | 365/189.12 X |
| 5,142,494 | 8/1992 | D'Luna | 365/189.12 X |

OTHER PUBLICATIONS

Y. Suzuki et al., "Clocked CMOS Calculator Circuitry" IEEE Journal of Solid-State Circuits, vol. sc-8, No. 6, Dec. 1973, pp. 462-469.

*Primary Examiner*—Jack B. Harvey
*Assistant Examiner*—Michael A. Whitfield
*Attorney, Agent, or Firm*—Lowe, Price, LeBlanc & Becker

[57] ABSTRACT

A sequential access memory employs a dynamic type row address pointer 2 as a row address pointer for selecting row selection lines of a memory cell array 1, and a static type column address pointer 3 as a column address pointer for selecting a column selection lines 5 of memory cell array 1.

20 Claims, 11 Drawing Sheets

SEQUENTIAL ACCESS MEMORY AND ITS OPERATION METHOD

BACKGROUND OF THE INVENTION

1. Field of the Invention

The present invention relates generally to Sequential Access Memories (referred to as SAI hereinafter), and more particularly to the structure of an address pointer for selecting a row or a column of a memory cell array.

2. Description of the Background Art

Recently in the time of an information-oriented society, a signal processing technology particularly the technology of processing picture or video signals has become increasingly important. Conventionally this signal processing as done by an analog technology. However, recently due to the introduction of an integrated circuit it has been rapidly developed by utilizing a highly precise and more reliable digital technology.

When signal processing is done by using the digital technology, a semiconductor memory is necessary for temporarily storing a signal to delay the same signal. Particularly, concerning data representing one picture or video, data corresponding to each of the picture elements forming the picture are sequentially transmitted from a corner of the screen to be processed or his reason, an SAM is often used to delay those data.

FIG. 12 is a diagram schematically showing a structure of the main part of a conventional SAM. A memory cell array 1 includes a plurality of memory circuits 10 arranged in n rows and m columns. Each of the memory circuits 10 holds k bits of data. A plurality of row selecting lines 4 are provided corresponding to the rows of memory cell array 1, and a plurality of column selecting lines 5 are provided responsive to the columns of memory cell array 1.

A static type row address pointer 2a sequentially applies a plurality of row selecting signals Qr1–Qrn to a plurality of row selecting lines 4 for sequentially selecting one row of memory cell array 1. Row address pointer 2a includes a plurality of static type registers 30 for sequentially shifting data (row selecting signals) in synchronization with input clock signals, and even-numbered inverter circuits 31 for feeding back output signal of the last stage to the first stage of the registers 30. A inverter circuit 31 plays a role of a buffer for driving interconnection capacitance.

A static type column address pointer 3a sequentially applies column selecting signals Qc1–Qcm to column selecting lines 5 for sequentially selecting one column of memory cell array 1. As in the case of row address pointer 2a, column address pointer 3a includes a plurality of static type registers 30 for sequentially shifting data in synchronization with the input clock signals, and even numbered inverter circuits 31 for feeding back the output signal of the last stage to the first stage of the registers 30. The inverter circuits 31 also plays a role of a buffer for driving interconnection capacitance.

FIG. 13 is a timing chart showing the timing of the row selecting signals and the column selecting signals provided by address pointers 2a and 3a.

In the first cycle, a plurality of registers 30 included in row address pointer 2a sequentially shift data at a "H" level in response to the clock signals. Thereby, row selecting signals Qr1–Qrn sequentially attain a "H" level and m rows of memory cell array 1 are sequentially selected. In the first cycle, column selecting signal Qc1 is held at a "H" level by column address pointer 3a. As a result, memory circuit 10 of the first row and the first column, memory circuit 10 of the second row and the first column, ..., and memory circuit 10 of the nth row and the first column are sequentially selected. Datum are written into and read from the selected memory circuits.

"H" level data held at the last stage register 30 in row address pointer 2a is shifted to the first stage register 30 through inverter circuits 31. Accordingly, in the second cycle, row selecting signals Qr1–Qrn sequentially rise to a "H" level. Thereby, the first row to the nth row of memory cell array 1 are sequentially selected. In the second cycle, column selecting signal Qc2 is held at a "H" level by column address pointer 3a. Thereby, the second column of memory cell array 1 is selected so that the memory circuit 10 of the first row and the second column, memory circuit 10 of the second row and the second column, ..., and memory circuit 10 of the nth row and the second column are sequentially selected.

Similarly, in the mth cycle, memory circuit 10 of the first row and the mth column, memory circuit 10 of the second row and the mth column, ..., and memory circuit 10 of the nth row and the mth column are sequentially selected. "H" level data held at the last stage register 30 in column address pointer 3a is shifted to the first stage register 30 through inverter circuits 31. As a result, after memory circuit 10 of the nth of the row and the mth column of memory cell array 1 is selected, memory circuit 10 of the first row and the first column is selected. Thereafter, the first cycle to the mth cycle as mentioned above will be repeated.

FIG. 14 is a circuit diagram showing one example of a structure of a static type register 30 included in row address pointer 2a and column address pointer 3a.

The register 30 includes P channel MOS transistors P1–P4, N channel MOS transistors N1–N4, and inverters G1–G4. Transistors P1 and N1 constitute a CMOS transmission gate T1, transistors P2 and N2 constitute a CMOS transmission gate T2, transistors P3 and N3 constitute a CMOS transmission gate T3, and transistors P4 and N4 constitute a CMOS transmission gate T4. A clock signal clkA is applied to transistors N1, P2, P3, and N4, and a clock signal CLKB is applied to transistors P1, N2, N3, and P4. As shown in FIG. 15, clock signals clkA and clkB constitute a double phase clock the "H" level periods of which do not occur at the same time.

A signal $X_j$ provided from the former stage register is applied to a node n1, and a signal $X_{j+1}$ is provided to the next stage register from a node n3. Signal $X_{j+1}$ is applied to memory cell array 1 as a row or column selecting signal Q.

When clock signal clkA is at a "L" level, and clock signal clkB is at a "H" level, transmission gates T2 and T3 turn on, and transmission gates T1 and T4 turn off. Consequently, the signal applied to a node n2 is latched to a latch circuit constituted by inverters G1 and G2, and transmission gate T3, and the signal is also provided as a signal $X_{j+1}$ to node n3 through transmission gate T2 and inverters G3 and G4.

When clock signal clkA is at a "H" level, and clock signal clkB is at a "L" level, transmission gates T1 and T4 turn on, and transmission gates T2 and T3 turn off. Consequently, signal $X_j$ applied to node n1 is applied to node n2 through transmission gate T1, and inverters G1 and G2. Signal $X_{j+1}$ of node n3 is latched to the latch circuit constituted by inverters G3 and G4, and transmission gate T4. In this manner, signal $X_j$ applied to node n1 in response to clock signals clkA and clkB is shifted to node n3.

Referring to FIG. 15 a time period in which clock signal ClkA attains "L" only once and attains "H" only once is referred to as one cycle T. Regarding the clock signal applied to registers 30 forming row address pointer 2a, the time when each of the row selecting signals Qr1-Qrn is at a "H" level corresponds to one cycle T. In connection with the clock signal applied to register 30 forming column address pointer 3a, the time when each of the column selecting signals Qc1-Qcm is at "H" level corresponds to one cycle T.

Furthermore, even when the operation timing of row address pointer 2a is replaced with the one of column address pointer 3a, the same operation as mentioned above will be carried out.

As mentioned above, in the conventional SAM, for the purpose of stably holding data (selection signals) a static type address pointer constituted by a plurality of static type registers 30 was employed in both row address pointer 2a and column address pointer 3a. For this reason, many transistors were used, and the occupation area of the address pointer on a semiconductor chip was increased. This was obstruction in obtaining an high integrated SAM.

SUMMARY OF THE INVENTION

One object of the present invention is to ensure a stable operation while decreasing occupation area of a sequential access memory.

Another object of the present invention is to improve degree of integration of a sequential access memory.

Another object of the present invention is to obtain a high integrated SAM decreasing occupation area of an address pointer while ensuring stable operation and to provide its operation method.

The sequential access memory of the present invention includes a memory cell array including a plurality of memory circuits arranged in rows and columns, a first selection circuit repeating selection operation of sequentially selecting a row or a column of the memory cell array in synchronization with a first clock signal changing in a first period, in a second period and a second selection circuit repeating selection operation of sequentially selecting a column or a row of the memory cell array in synchronization with a second clock signal changing in said second period. The first selection circuit includes a plurality of first holding circuits dynamically holding data. The second selection circuit includes a plurality of second holding circuits statically holding data.

The first selection circuit may additionally include a feed back loop for feeding back data held in the first holding circuit of the last stage to the holding circuit of the first stage, and a third holding circuit for statically holding data to be provided to the feedback loop.

The dynamic type holding circuit needs to operate faster even though it is constituted by less transistors than a static type holding circuit. Although the static type holding circuit includes more transistors than the dynamic type holding circuit, it can operate stably at a low speed.

In a sequential access memory of the present invention, a first selection circuit operated at high speed is constituted by a dynamic type holding circuit, and a second selection circuit operated at a low speed is constituted by a static type holding circuit. As a result, it can decrease the number of the transistors while ensuring a stable operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
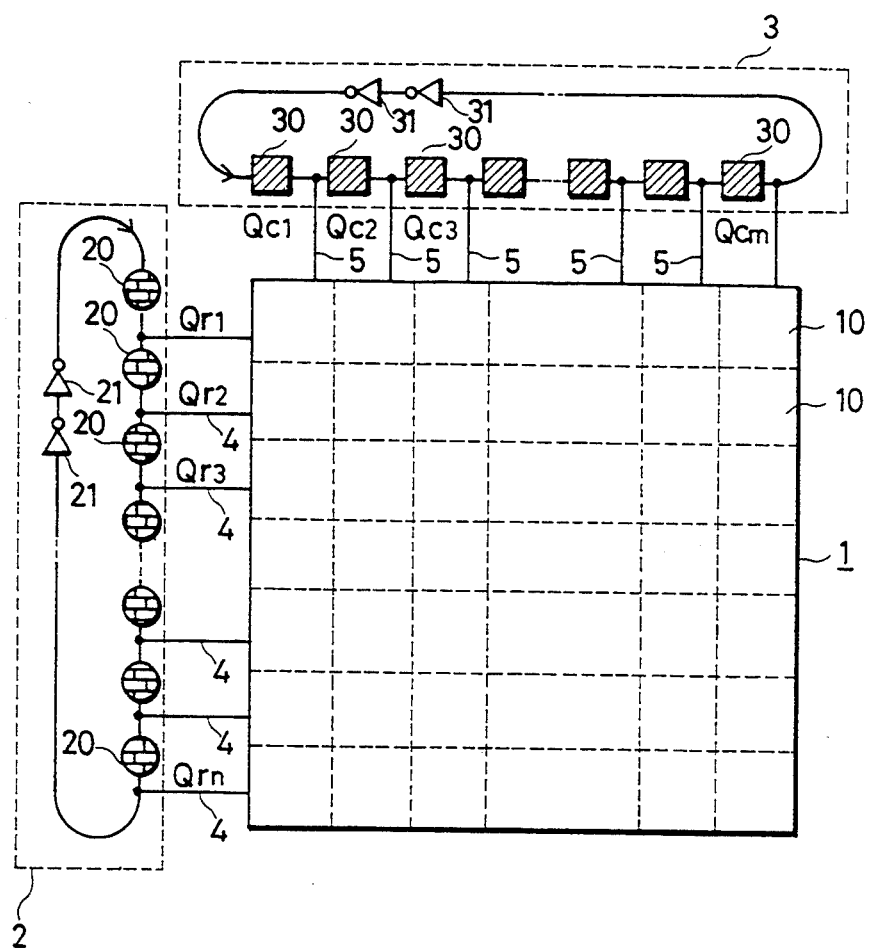
FIG. 1 is a diagram showing a structure of a main part of a SAM in accordance with one embodiment of the present invention.
Figure 12:
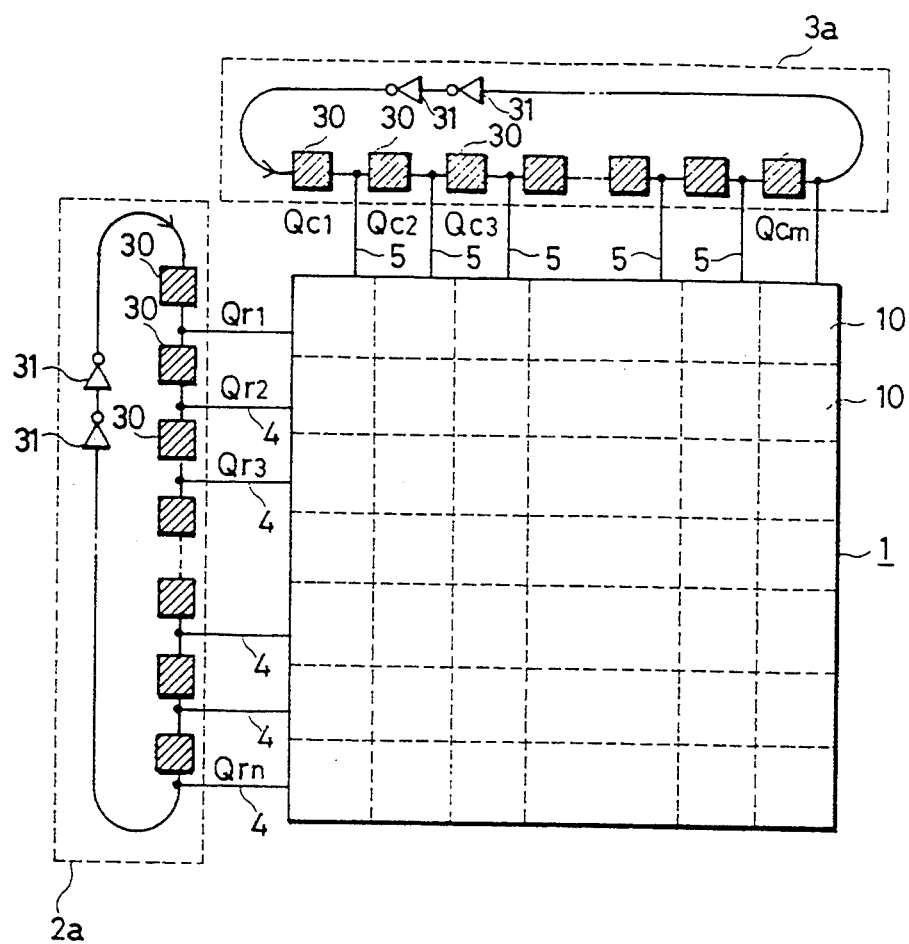
FIG. 12 is a diagram showing the structure of the main part of a conventional SAM.

The structures of a memory cell array 1 shown in FIG. 1 and the memory cell array 1 of a conventional SAM shown in FIG. 12 are the same. In this embodiment, a dynamic type row address pointer 2 is provided instead of a static type row address pointer 2a in the conventional SAM. A static type column address pointer 3 corresponds to a static type column address pointer 3a in the conventional SAM.

Row address pointer 2 includes a plurality of dynamic type registers 20 connected in series, and even numbered inverter circuits 21 feeding back an output signal from the last stage register 20 to the first stage register 20 to sequentially shift data in synchronization with the clock signals. Thereby, row selecting signals Qr1-Qrn are sequentially applied to a plurality of row selection lines 4.

Figure 2:
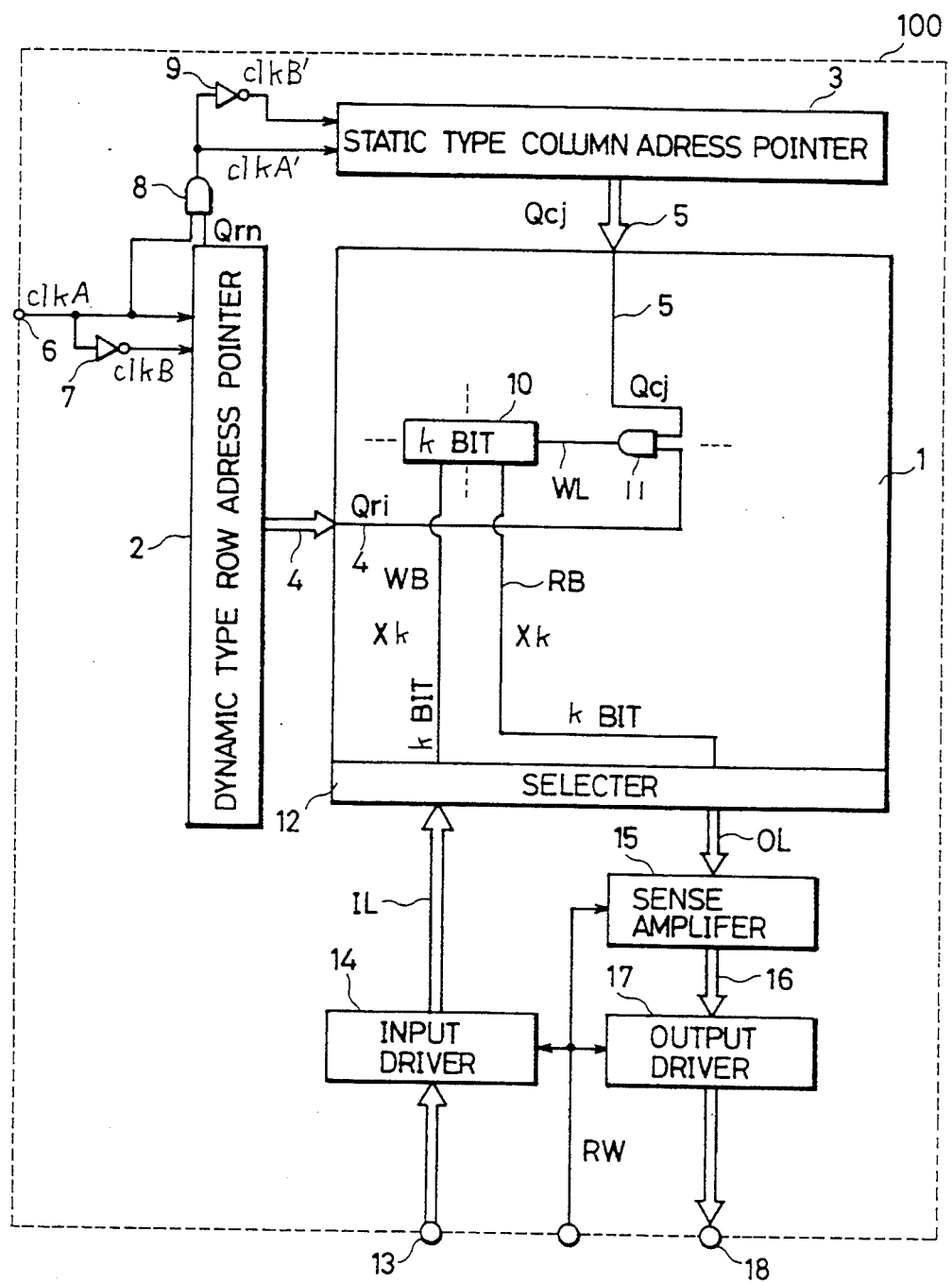
FIG. 2 is a diagram showing the entire structure of the same embodiment.

FIG. 2 shows the entire structure of a SAM in accordance with the present embodiment. SAM is formed on a semiconductor chip 100. Only one memory circuit 10 is shown in memory cell array 1. Memory cell 10 includes k memory cells to store k bits of data. One of the plurality of row selection lines 4 is connected to one input terminal of an AND circuit 11. One of the plurality of column selection lines 5 is connected to another input terminal. An output terminal of AND circuit 11 is connected to memory circuit 10 through a word line WL. Memory circuit 10 is connected to k write bit lines WB and k read out bit lines RB.

A clock signal clkA is applied to a clock input terminal 6. Clock signal clkA applied to clock input terminal 6 is applied to row address pointer 2 and an inverter 7. The output signal of inverter 7 is applied to row address pointer 2 as a clock signal clkB. Row selecting signal Qrn provided from row address pointer 2 is applied to one input terminal of an AND circuit 8, and clock signal clkA is applied to another input terminal thereof. The output signal of AND circuit 8 is applied to a column address pointer 3 and an inverter 9 as a clock signal clkA'. The output signal of inverter 9 is applied to column address pointer 3 as a clock signal clkB'.

Figure 3:
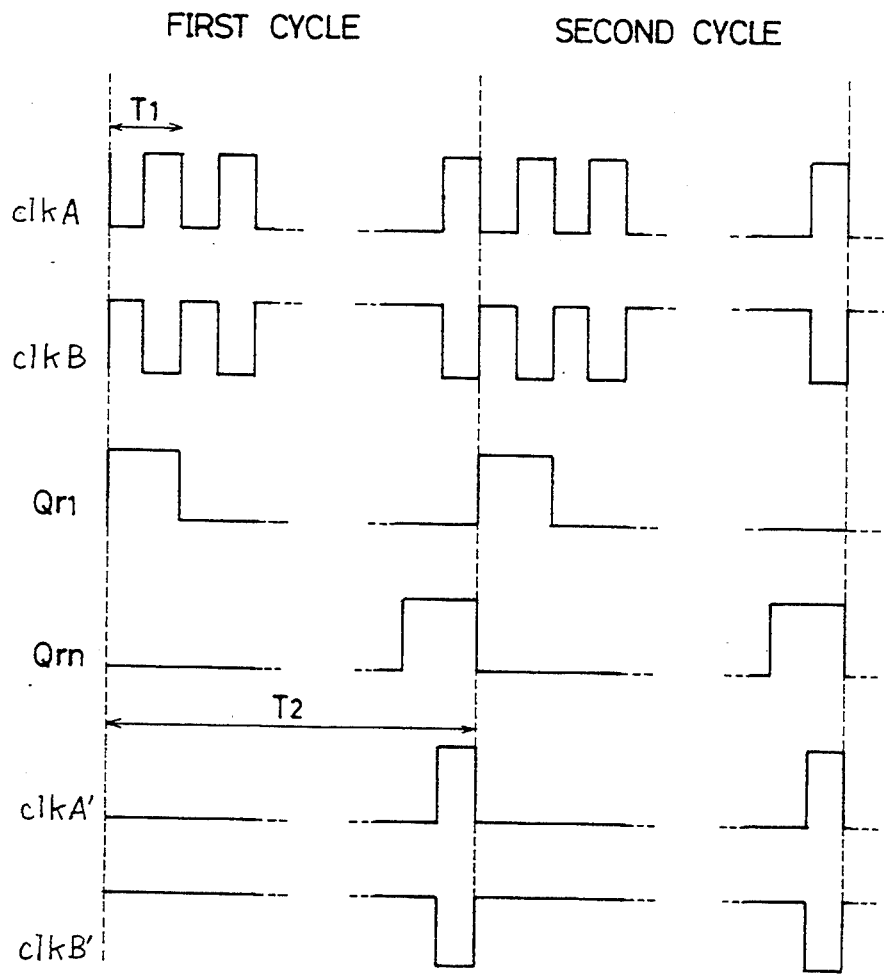
FIG. 3 is a timing chart for describing the operation of the same embodiment.

FIG. 3 shows waveforms of clock signals clkA and clkB, row selecting signals Qr1 and Qrn, and clock signals clkA' and clkB'.

Figure 13:
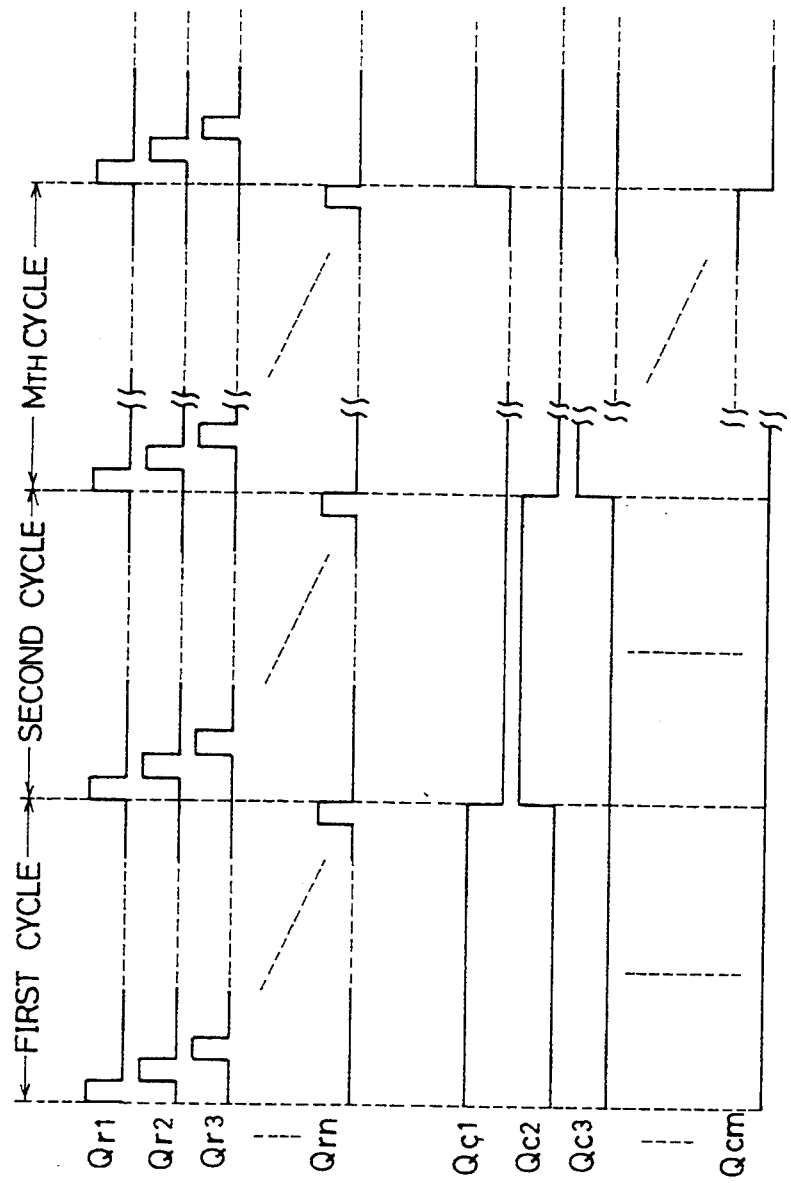
FIG. 13 is a timing chart for describing the operation of the SAM.

Clock signals clkA and clkB change in a period T1. Row selecting signals Qr1-Qrn sequentially rise to a "H" level in response to clock signals clkA and clkB. Clock signals clkA' and clkB' change in a period T2. Column selecting signals Qc1-Qcm sequentially rise to a "H" level in response to clock signals clkA' and clkB' (see FIG. 13).

In FIG. 2, when both row selecting signals Qri and column selecting signal Qcj attain a "H" level, a potential of a word line WL attains a "L" level, and memory circuit 10 is selected. At this time, a write bit line WB is connected to a data input line IL by a selector 12, and a read out bit line RB is connected to a data output line OL.

When an externally applied read out/write signal RW is indicating write operation, an input driver 14 is rendered active. Thereby, data externally applied to a data input terminal 13 is applied to write bit line WB through an input driver 14 data input line IL, and selector 12. As a result, data is written into memory circuit 10.

When read out/write signal RW is indicating read operation, a sense amplifier 15 and an output driver 17 are rendered active. Thereby, data read out from memory circuit 10 to a read out bit line RB is provided to a data output terminal 18 through selector 12, data output line OL, sense amplifier 15, a sense amplifier output line 16, and output driver 17.

Figure 4:
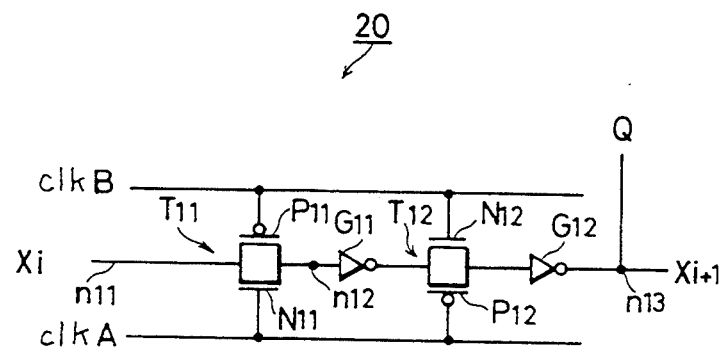
FIG. 4 is a circuit diagram showing one example of the structure of a dynamic type register.

FIG. 4 shows a structure of a dynamic type register 20. Register 20 includes P channel MOS transistors P11 and P12, N channel MOS transistors N11 and N12, and inverters G11 and G12. Transistors P11 and N11 constitute a CMOS transmission gate T11, and transistors N12 and P12 constitute a CMOS transmission gate T12.

Figure 15:
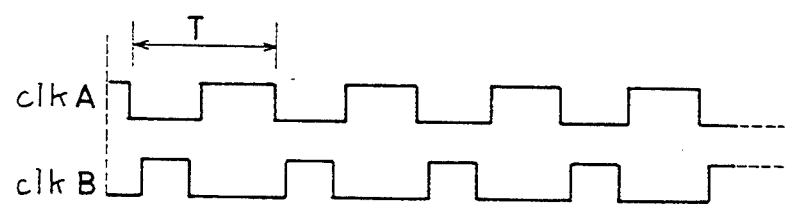
FIG. 15 is a timing chart showing the clock signals applied to the address pointer.

Clock signal clkB is applied to the gates of transistors P11 and N12, and clock signal clkA is applied to the gates of transistors N11 and P12. Clock signals clkA and clkB constitute a double phase clock signal shown in FIGS. 3 and 15. A signal Xi provided from the former stage register is applied to node n11. A signal $X_{i+}$ provided from node n13 is applied to the next register. Signal $X_{i+1}$ is applied to memory cell array 1 as a row selection signal Q.

When clock signal clkA is at "L" level, and clock signal clkB is at a "H" level, transmission gate T11 turns off, and transmission gate T12 turns on. Thereby, data held at interconnection capacitance (parasitic capacitance) connected to node n12 is provided to node n13 through inverter G11, transmission gate T12, and inverter G12. When clock signal clkA is at a "H" level, and clock signal CLKB is at a "L" level, transmission gate T11 turns on, and transmission gate T12 turns off. Consequently, data applied to node n11 is applied to node n12 through transmission gate T11.

Dynamic type register 20 shown in FIG. 4 cannot hold data for relatively long time nor operate at low speed since it does not have a stable data holding circuit in the internal circuit. However, dynamic type register 20 includes fewer transistors than a static type register 30 shown in FIG. 14. Therefore, it is possible to decrease occupation area on a semiconductor chip 100.

Figure 14:
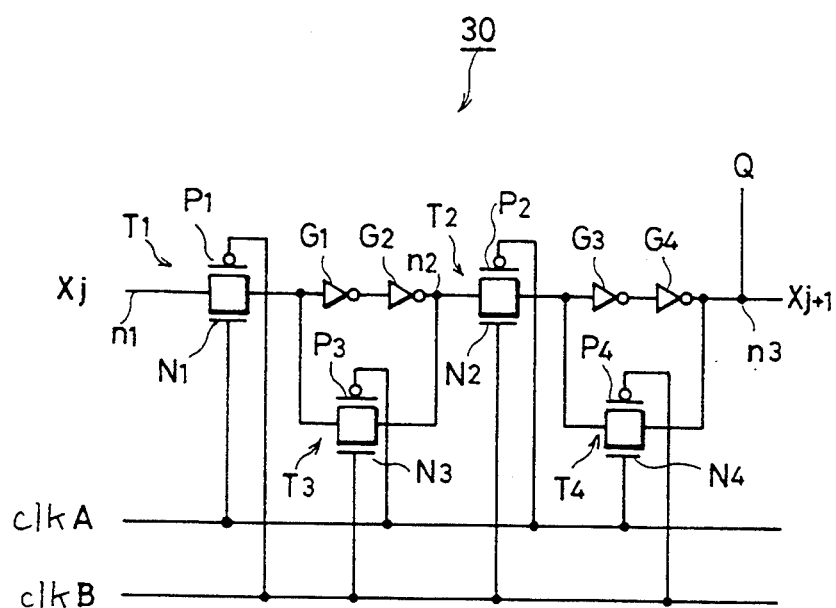
FIG. 14 is a circuit diagram showing one example of the structure of the static type register.

The structure of static type registers 30 included in static type address pointer 3 shown in FIG. 1 is the same as the one shown in FIG. 14.

Static type register 30 can hold data for a relatively long time because it has a stable data holding circuit in the internal circuit. Therefore, static type register 30 is capable of operation at low speed.

The present embodiment can decrease the occupation area while ensuring stable operation. The reason for this is that the row address pointer 2 which operates in synchronization with clock signals clkA and clkB of a relatively short period T1 is constituted by dynamic type registers 20 and column address pointer 3 which operates in synchronization with clock signals clkA' and clkB' of a relatively long period T2 is constituted by static type registers 30.

Figure 5:
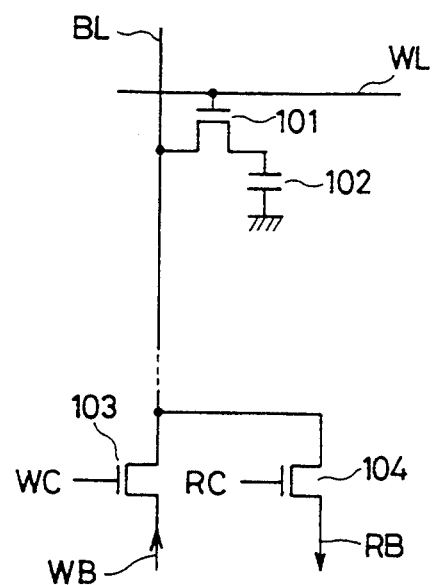
FIG. 5 is a circuit diagram showing one example of the structure of a memory cell.

FIG. 5 shows a structure of one of the memory cells included in memory circuit 10. The memory cell includes a transfer gate transistor 101 and a storage capacitor 102. Storage capacitor 102 is connected to a bit line BL through transfer gate transistor 101, and the gate of transfer gate transistor 101 is connected to a word line WL. Bit line BL is connected to a write bit line WB through a transistor 103 and to a read out bit line RB through a transistor 104.

A write control signal WC is applied to the gate of transistor 103, and a read out control signal RC is applied to the gate of transistor 104. Write control signal WC and read control signal RC are the control signals responsive to a read/write signal RW shown in FIG. 2.

In write operation, write control signal WC attains a "H" level, and transistor 103 turns on. Thus, bit line BL is connected to write bit line WB. In read operation, read control signal RC attains a "H" level, and transistor 104 turns on. Thereby, bit line BL is connected to read bit line RB.

Transistors 103 and 104 may be commonly provided for a plurality of memory cells.

There is a possibility of row address pointer 2 dissipating data when feeding back a signal of the last stage register 20 to the first stage register 20 or the last stage register 20 may not drive inverter circuits 21 forming a feed back loop since it is constituted by a plurality of dynamic type registers 20. Examples of the structure for the purpose of solving these problems are shown in FIGS. 6 and 7.

Figure 6:
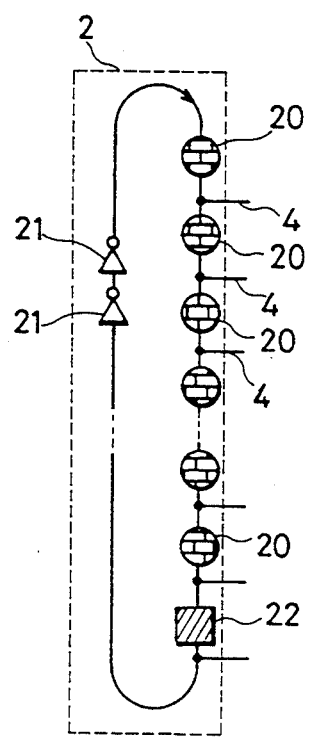
FIG. 6 is a diagram showing one example of an improvement of a dynamic type address pointer.
Figure 7:
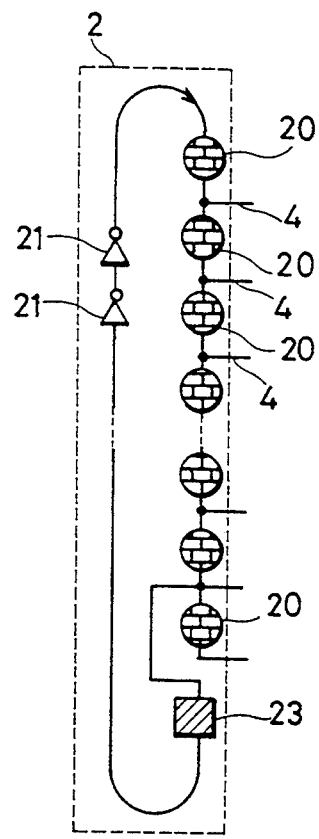
FIG. 7 is a diagram showing another example of the improvement of the dynamic type address pointer.

In row address pointer 2 in FIG. 6, only the last stage register is constituted by a static type register 22. In row address pointer 2 in FIG. 7, a static type register 23 is provided in parallel with the last stage dynamic type register 20. In both examples, a clock (data) fed back to the first stage register 20 is provided from static type registers 22 or 23. As a result, a fed back clock becomes stable, and it becomes possible to drive inverter circuits 21 forming the feedback loop.

Figure 8:
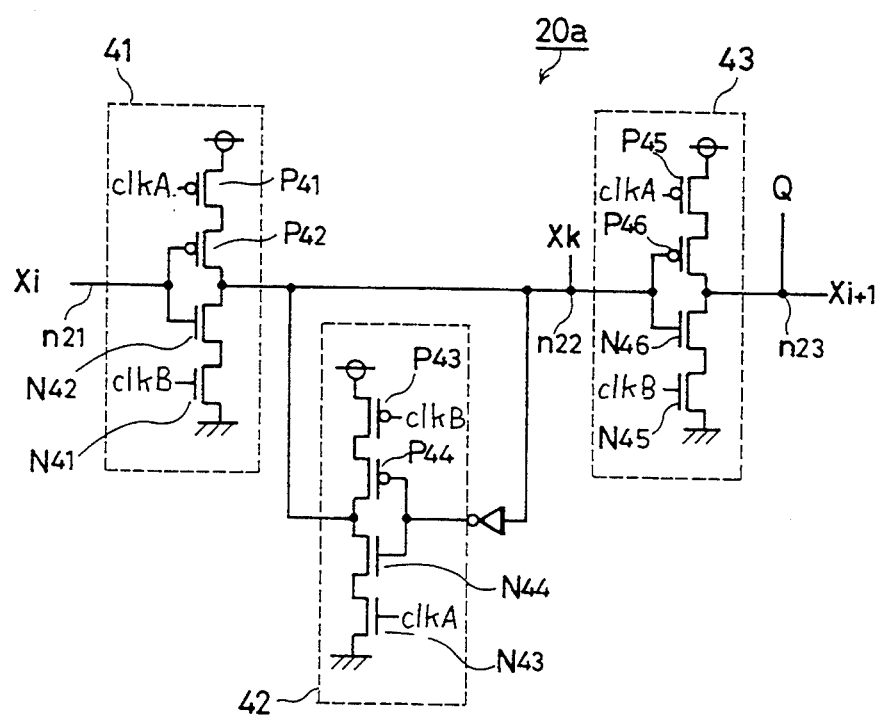
FIG. 8 is a circuit diagram showing one example of the structure of a semistatic type register.

FIG. 8 is a circuit diagram showing another example of the structure of the register included in row address pointer 2.

A register 20a shown in FIG. 8 is disclosed in "Clocked CMOS Calculator Circuitry", Y. Suzuki, K. Odagawa and T. Abe, IEEE J. Solid-State Circuits, Vol. SC-8, No. 6, pp. 462–469, Dec. 1973, and it is referred to as a semistatic type register.

The semistatic type register 20a includes clocked CMOS circuits 41, 42, and 43. Clocked CMOS circuit 41 includes P channel MOS transistors P41 and P42, and N channel MOS transistors N41 and N42. Clocked CMOS circuit 42 includes P channel MOS transistors P43 and P44, and N channel MOS transistors N43 and N44. Clocked CMOS circuit 43 includes P channel MOS transistors P45 and P46, and N channel MOS transistors N45 and N46. A signal $X_i$ is provided to node n21 from the former stage register. A signal $X_{i+1}$ provided from node n23 is applied to the next stage register.

Semistatic type register 20a includes more transistors than the static type register 30 shown in FIG. 14, but according to the article as mentioned above, the occupation area on a semiconductor chip can be decreased approximately by half than the one in static type register 30 for the following reasons; it has few interconnection areas and few contact holes.

Figure 9:
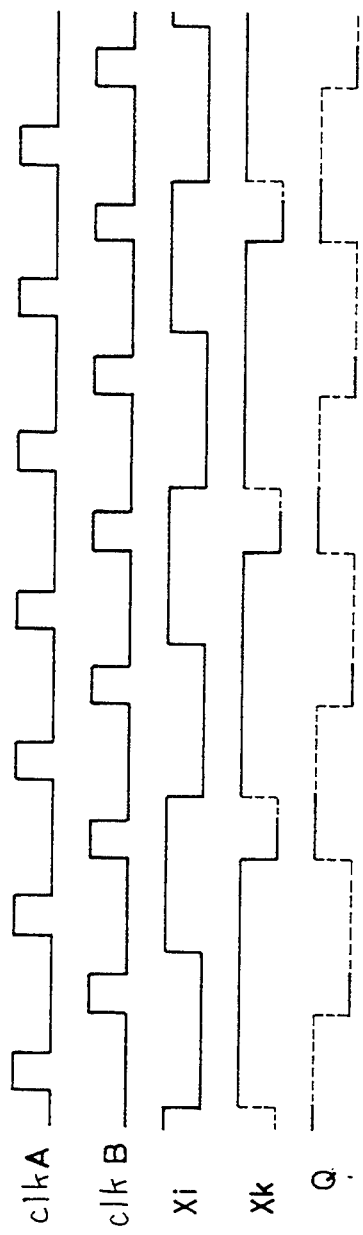
FIG. 9 is a timing chart for describing the operation of the semistatic type register.

FIG. 9 shows waveforms of a clock signal qlkA, a signal Xi of node n21, a signal X of node n22, and a selection signal Q of node n23. Clock signals clkA and clkB are similar to the clock signals shown in FIGS. 3 and 15.

When clock signal clkA is at a "H" level, and clock signal clkB is at a "L" level, clocked CMOS circuits 41 and 43 are rendered in-active, and clocked CMOS circuit 42 is rendered active. When clock signal clkA is at a "L" level, and clock signal clkB is at "H" level, clocked CMOS circuits 41 and 43 is rendered active and clocked CMOS circuit 42 is rendered in-active.

Semistatic type register 20a performs static operation stably holding the signal and dynamic operation storing the signal in interconnection capacitance. The part denoted by a solid line represents the period in which the value of the signal is fixed by static operation, and the part denoted by a dotted line represents the period in which the value of the signal is stored and held in interconnection capacitance by dynamic operation.

As can be seen from FIG. 9, selecting signal Q is shifted toward signal Xi by one clock of clock signal clkA. It should be clear that the semistatic type register 20a shown in FIG. 8 operates in the same manner as the static type register 30. Therefore, even if row address pointer 2 or column address pointer 3 operated in response to an input clock signal is constituted by utilizing semistatic type register 20a shown in FIG. 8, the same effect as mentioned above can be achieved.

Figure 10:
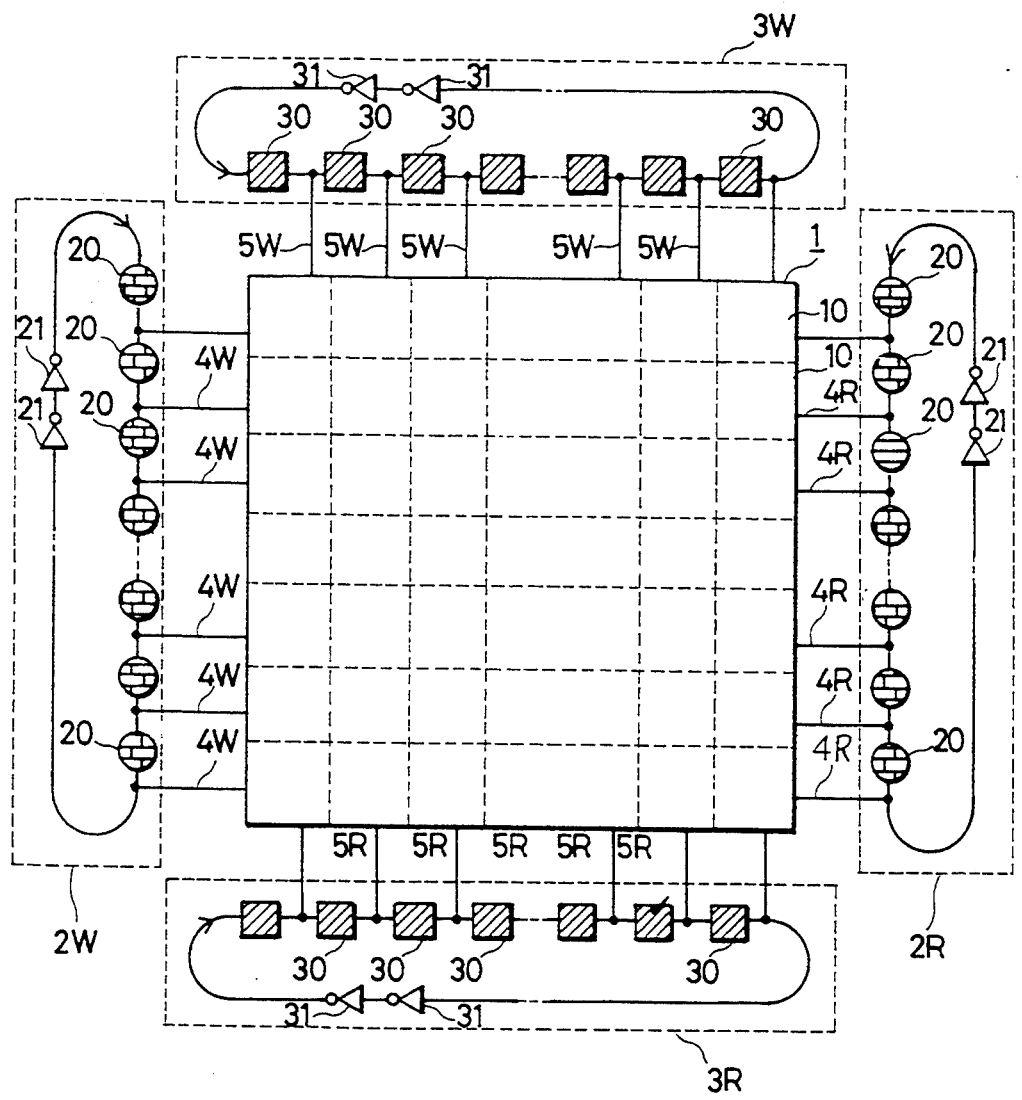
FIG. 10 is a diagram showing the structure of the main part of an SAM in accordance with another embodiment of the present invention.

FIG. 10 schematically shows a structure of the main part of SAM in accordance with another embodiment of the present invention.

In the embodiment, a type row address pointer 2W for writing, a static type column address pointer 3W for writing, a dynamic type row address pointer for reading 2R, and a static type column address pointer 3R for reading are provided. Row address pointer 2W is connected to row selection lines 4W for writing, and row address pointer 2R is connected to row selection lines 4R for reading. Column address pointer 3W is connected to column selection lines 5W for writing, and column address pointer 3R is connected to column selection lines 5R for reading. Row address pointers 2W and 2R have the same structures as the row address pointer 2 shown in FIG. 1. Also, column address pointers 3W and 3R have the same structures as the address column address pointer 3 shown in FIG. 1.

Figure 11:
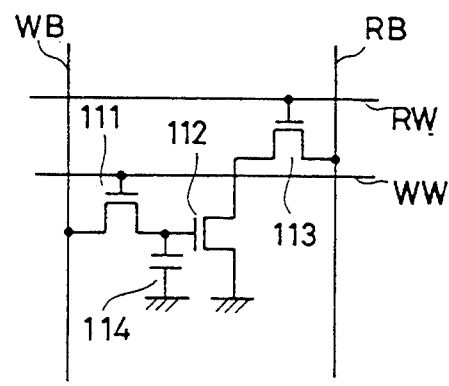
FIG. 11 is a circuit diagram showing one example of the structure of a memory cell included in the SAM of FIG. 10.

FIG. 11 shows one structure of the memory cells included in memory circuit 10. The memory cell includes three transistors 111, 112, and 113, and a storage capacitor 114. Storage capacitor 114 is connected to write bit line WB through transistor 111 and read bit line RB through transistors 112 and 113. The gate of transistor 111 is connected to a write word line WW, and the gate of transistor 113 is connected to a read word line RW. Write word line WW corresponds to row selection line for writing 4W, and read out word line RW corresponds to row selection line for reading 4R. Write bit line WB corresponds to column selection line for writing 5W, and read bit line RB corresponds to column selection line for reading 5R.

In the embodiment SAM shown in FIG. 10, write operation and read out operation are carried out independently to each other. In the embodiment, it is possible to decrease the occupation areas while ensuring stable operation.

In the embodiments of FIGS. 1 and 10, the dynamic type address pointer was used as a row address pointer. However, in SAM where a column address pointer operates in synchronization with the applied clock signal, the dynamic type address pointer may be used as a column address pointer.

Figure 16:
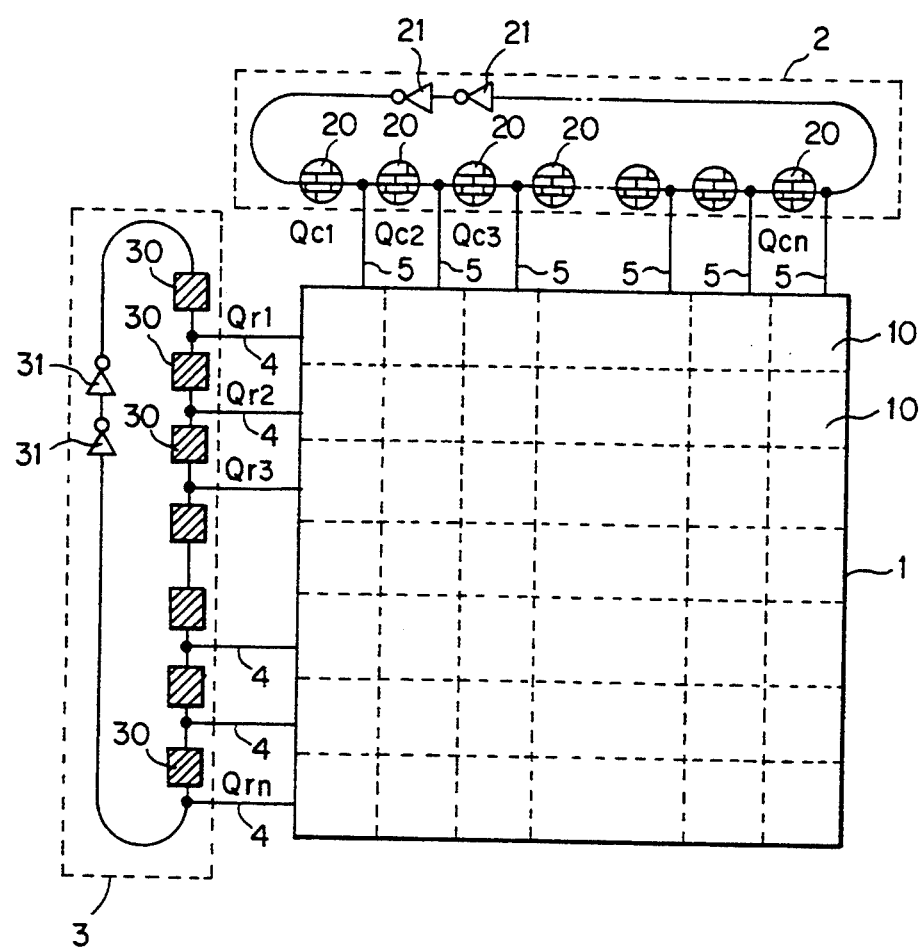
FIG. 16 is a diagram showing the structure of the main part of a SAM in accordance with yet another embodiment of the present invention.

FIG. 16 shows an embodiment in which a dynamic type address pointer 2 is used as a column address pointer, and a static type address pointer 3 is used as a row address pointer. The form of the memory cell array of the present invention is applicable not only to the form of the embodiments mentioned above, but can be applied to the other forms of memory cell array.

It should be noted that it is possible to decrease the occupation areas of the first selection circuit in accordance with the present invention while ensuring stable operation. As a result, a highly integrated sequential access memory can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sequential access memory, comprising:
    a memory cell array including a plurality of memory means arranged in rows and columns;
    first selection means for repeating an operation of sequentially selecting said rows of said memory cell array in synchronization with a first clock signal having a first period,
    said first selection means including a plurality of first holding means for dynamically holding a first signal; and
    second selection means for repeating an operation of sequentially selecting said columns of said memory cell array in synchronization with a second clock signal having a second period greater than said first period, said second selection means including a plurality of second holding means for statically holding a signal.

2. The sequential access memory according to claim 1, wherein said plurality of first holding means of said first selection means are connected in series;

said first selection means is operable to sequentially shift said first signal from a first holding means of the first stage to a first holding means of the last stage in synchronization with said first clock signal for the sequential selection of said rows of said memory cell array, and further comprises a feedback loop for feeding back said first signal from the holding means of the last stage to the holding means of the first stage, and said plurality of second holding means of said second selection means are connected in series, said second selection means operates to sequentially shift the second signal from a second holding means of the first stage to a second holding means of the last stage in synchronization with said second clock signal for the sequential selection of said columns of said memory cell array, and further comprises a feedback loop for feeding back the signal from the holding means of the last stage to the holding means of the first stage.

3. The sequential access memory according to claim 2, wherein each of said plurality of second holding means includes:

a static type register statically holding applied data in response to said second clock signal and providing the applied data.

4. The sequential access memory according to claim 3, wherein each of said plurality of first holding means includes:

a dynamic type register dynamically holding applied data in response to said first clock signal and providing the applied data.

5. The sequential access memory according to claim 4, wherein said dynamic type register includes:
an input node;
an interconnection having a parasitic capacitance;
an output node;
a first transmission gate connected between said input node and said parasitic capacitance; and
a second transmission gate connected between said parasite capacitance and said output node;
said first and second transmission gates being complementary activated/in-activated in response to said first clock signal.

6. The sequential access memory according to claim 4, wherein said static type register includes:
an input node;
a first latch circuit for latching a signal;
a second latch circuit for latching a signal;
a first transmission gate connected between said input node and said first latch circuit;
a second transmission gate connected between said first latch circuit and said second latch circuit; and
an output node for applying an output of said second latch circuit to said memory cell array as a selection signal;

said first transmission gate and said second latch circuit being simultaneously activated/in-activated in response to said second clock signal, said first latch circuit and said second transmission gate being simultaneously activated/in-activated in response to said second clock signal, and said first and second transmission gates being complementarily activated/in-activated in response to said second clock signal.

7. The sequential access memory according to claim 3, wherein each of said plurality of first holding means includes:

a semistatic type register for performing an operation having a period of statically holding a signal and a period of dynamically holding a signal.

8. The sequential access memory according to claim 7, wherein said semistatic type register includes:
an input node;
an interconnection having a parasitic capacitance;
an output node;
a first clocked CMOS inverter connected between said input node and said interconnection;
a second clocked CMOS inverter connected in parallel with said interconnection; and
a third clocked CMOS inverter connected between said interconnection and said output node;
said first, second, and third clocked CMOS inverters being operated to have a period in which a signal is stored in said parasitic capacitance and a period of statically holding said signal in response to said first clock signal.

9. The sequential access memory according to claim 1, further comprising:

writing/reading means for writing/reading data to/from memory means selected by said first and second selection means.

10. The sequential access memory according to claim 1, wherein each of said plurality of memory means includes:

a plurality of dynamic type memory cells for storing one or more bits of data.

11. The sequential access memory according to claim wherein said first clock signal includes a double phase clock signal; and said second clock signal includes a double phase clock signal.

12. The sequential access memory according to claim 2, wherein said feedback loop includes a plurality of inverters.

13. A sequential access memory, comprising:
a memory cell array including a plurality of memory mans arranged in rows and columns;
first selection means for repeating an operation of sequentially selecting said rows of said memory cell array in synchronization with a first clock signal having a first period,
said first selection means including a plurality of first holding means for dynamically holding a first signal; and
second selection means for repeating an operation of sequentially selecting said columns of said memory cell array in synchronization with a second clock signal having a second period greater than said first period, said second selection means including a plurality of second holding means for statically holding a second signal, and
clock signal generating means for generating said second clock signal in response to one of the outputs of said plurality of first holding means of said first selection means.

14. A sequential access memory, comprising:
a memory cell array including a plurality of memory means arranged in rows and columns;
first selection means for repeating an operation of sequentially selecting said rows of said memory cell array in synchronization with a first clock signal having a first period,
said first selection means including a plurality of first holding means for dynamically holding a first signal;
wherein said plurality of first holding means of said first selection means are connected in series;
said first selection means is operable to sequentially shift said first signal from a first holding means of the first stage to a first holding means of the last stage in synchronization with said first clock signal for the sequential selection of said rows of said memory cell array, and further comprises a feedback loop for feeding back said first signal from the holding means of the last stage to the holding means of the first stage,
second selection means for repeating an operation of sequentially selecting said columns of said memory cell array in synchronization with a second clock signal having a second period greater than said first period,
said second selection means including a plurality of second holding means for statically holding a second signal,
said plurality of second holding means of said second selection means are connected in series,
said second selection means operates to sequentially shift the second signal from a second holding means of the first stage to a second holding means of the last stage in synchronization with said second clock signal for the sequential selection of said columns of said memory cell array, and further comprises a feedback loop for feeding back the signal from the holding means of the last stage to the holding means of the first stage, and
wherein said first selection means further includes:
third holding means for statically holding a signal to be provided to said feedback loop.

15. A sequential access memory, comprising:
a memory cell array including a plurality of memory means arranged in rows and columns;
first selection means for repeating an operation of sequentially selecting said rows of said memory cell array in synchronization with a first clock signal having a first period,
said first selection means including a plurality of first holding means for dynamically holding a first signal;
wherein said plurality of first holding means of said first selection means are connected in series;
said first selection means is operable to sequentially shift said first signal from a first holding means of the first stage to a first holding means of the last stage in synchronization with said first clock signal for the sequential selection of said rows of said memory cell array, and further comprises a feedback loop for feeding back said first signal from the holding means of the last stage to the holding means of the first stage,
second selection means for repeating an operation of sequentially selecting said columns of said memory cell array in synchronization with a second clock signal having a second period greater than said first period,
said second selection means including a plurality of second holding means for statically holding a second signal,
said plurality of second holding means of said second selection means are connected in series,
said second selection means operates to sequentially shift the second signal from a second holding means of the first stage to a second holding means of the last stage in synchronization with said second clock signal for the sequential selection of said columns of said memory cell array, and further comprises a feedback loop for feeding back the signal from the holding means of the last stage to the holding means of the first stage, and
wherein said first selection means further includes:
third holding means coupled between an output of the first holding means of the last stage and said feedback loop to statically hold a signal.

16. A sequential access memory, comprising:
a memory cell array including a plurality of memory means arranged in rows and columns;
first selection means for repeating an operation of sequentially selecting said rows of said memory cell array in synchronization with a first clock signal having a first period,
said first selection means including a plurality of first holding means for dynamically holding a first signal;
wherein said plurality of first holding means of said first selection means are connected in series;
said first selection means is operable to sequentially shift said first signal from a first holding means of the first stage to a first holding means of the last stage in synchronization with said first clock signal for the sequential selection of said rows of said memory cell array, and further comprises a feedback loop for feeding back said first signal from the holding means of the last stage to the holding means of the first stage,
second selection means for repeating an operation of sequentially selecting said columns of said memory cell array in synchronization with a second clock signal having a second period greater than said first period,
said second selection means including a plurality of second holding means for statically holding a second signal,
said plurality of second holding means of said second selection means are connected in series,
said second selection means operates to sequentially shift the second signal from a second holding means of the first stage to a second holding means of the last stage in synchronization with said second clock signal for the sequential selection of said columns of said memory cell array, and further comprises a feedback loop for feeding back the signal from the holding means of the last stage to the holding means of the first stage, and
wherein said first selection means further includes:

third holding means coupled between an input of the first holding means of the last stage and said feedback loop to statically hold a signal.

17. A sequential access memory, comprising:

a memory cell array including a plurality of memory means arranged in rows and columns;

first selection means for repeating an operation of sequentially selecting said rows of said memory cell array in synchronization with a first clock signal having a first period, said first selection means including a plurality of first holding means for dynamically holding a first signal;

second selection means for repeating an operation of sequentially selecting said columns of said memory cell array in synchronization with a second clock signal having a second period greater than said first period, said second selection means including a plurality of second holding means for statically holding a second signal;

third selection means for repeating an operation of sequentially selecting said rows of said memory cell array in synchronization with a third clock signal changing in said first period said third selection means including a plurality of third holding means for dynamically holding a third signal;

fourth selection means for repeating an operation of sequentially selecting said columns of said memory cell array in synchronization with a fourth clock signal changing in said second period, said fourth selection means including a plurality of fourth holding means for statically holding a fourth signal;

write means for writing data to memory means selected by said first and second selection means; and read means for reading data from memory means selected by said third and fourth selection means.

18. A sequential access memory, comprising:

a memory cell array including a plurality of memory means arranged in rows and columns;

first selection means for repeating in a prescribed period a selection operation of sequentially selecting columns of said memory cell array in synchronization with an externally applied first clock signal having a first period, said first selection means including a plurality of first holding means for dynamically holding a first signal; and second selection means for repeating a selection operation for sequentially selecting rows of said memory cell array in synchronization with a second clock signal having a second period greater than said first period, said second selection means including a plurality of second holding means for statically holding a second signal.

19. A sequential access memory, comprising:

a memory cell array including a plurality of memory means arranged in rows and columns;

first selection means for repeating in a prescribed period a selection operation of sequentially selecting rows (columns) of said memory cell array in synchronization with an externally applied clock signal, said first selection means including a plurality of first holding means for dynamically holding a first signal; and second selection means for repeating a selection operation for sequentially selecting columns or rows of said memory cell array in synchronization with said prescribed period, said second selection means including a plurality of second holding means for statically holding a second signal, and wherein said plurality of fist holding means of said first selection means are connected in series, said first selection means further includes a feedback loop for feeding back the signal held at first holding means of the last stage to first holding means of the first stage, and third holding means for statically holding the signal to be provided to said feedback loop.

20. An operation method of a sequential access memory including a plurality of memory means arranged in rows and columns, comprising the steps of:

repeating an operation of sequentially selecting said rows in synchronization with a first clock signal having a first period by utilizing first selection means including a plurality of first holding means for dynamically holding a first signal; and repeating an operation of sequentially selecting said columns in synchronization with a second clock signal having a second period greater than said first period by utilizing second selection means including a plurality of second holding means for statically holding a second signal.

* * * * *